(12) United States Patent
Takeda

(10) Patent No.: US 6,226,220 B1
(45) Date of Patent: May 1, 2001

(54) SEMICONDUCTOR MEMORY DEVICE

(75) Inventor: Koichi Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/664,384

(22) Filed: Sep. 18, 2000

(51) Int. Cl.$^7$ ............................................. G11C 8/00
(52) U.S. Cl. ............................................. 365/230.06
(58) Field of Search ................... 365/230.06, 207, 365/208

(56) References Cited

U.S. PATENT DOCUMENTS

| | | | |
|---|---|---|---|
| 5,826,056 | * 10/1998 | Noda | 365/230.06 |
| 5,946,264 | * 8/1999 | McClure | 365/230.06 |
| 6,067,264 | * 5/2000 | Kwon | 365/230.06 |
| 6,160,746 | * 12/2000 | Park et al. | 365/230.06 |

* cited by examiner

*Primary Examiner*—Trong Phan
(74) *Attorney, Agent, or Firm*—Young & Thompson

(57) ABSTRACT

The present invention provides a semiconductor memory device comprising: at least one memory cell array further comprising: a plurality of word lines; plural pairs of bit lines; plural memory cells, each of the memory cells being connected to both one of the word line and one pair of the bit lines; a same number of column selecting circuits as the pairs of bit lines so that each of the column selecting circuits is connected to corresponding one pair of the bit lines; a write driver connected in parallel to the column selecting circuits; a sense amplifier connected in parallel to the column selecting circuits and the sense amplifier being activated for read operation and being inactivated for write operation; and a same number of read/write common column selecting lines as the pairs of bit lines so that each of the read/write common column selecting lines is connected to corresponding one of the column selecting circuits; a row decoder connected to the word lines for activating one of the word lines; and a column decoder connected to the read/write common column selecting lines for activating selected one of the read/write common column selecting lines for both read and write operations.

13 Claims, 8 Drawing Sheets

SEMICONDUCTOR MEMORY DEVICE

BACKGROUND OF THE INVENTION

The present invention relates to a semiconductor memory device, and more particularly to a static random access memory improved in high speed reading and writing operations with a reduced hardware scale necessary for column selecting operation.

FIG. 1 is a diagram illustrative of a first conventional semiconductor memory device. The first conventional semiconductor memory device has a (M-row×N-column) array of memory cells 104(1,1), - - - 104(1,N), - - - 104(M,1), - - - 104(M,N), wherein N and M are the natural numbers. Word lines 106(1), 106(2), - - - 106(M) extend in parallel to a row direction, wherein each of the word lines 106(1), 106(2), - - - 106(M) 106(M) is connected to the memory cells 104(i,1), 104(i,2), - - - 104(i,N) which are aligned in the row direction along the each of the word lines 106(1), 106(2), - - - 106(M), where $1 \leq i \leq M$. Plural pairs of bit lines 105a(1), 105b(1), 105a(2), 105b(2), - - - 105a(N) and 105b(N) extend in parallel to a column direction perpendicular to the row direction, wherein each pair of the bit lines 105a(1), 105b(1), 105a(2), 105b(2), - - - 105a(N) and 105b(N) is connected to the memory cells 104(1,j), 104(2,j), - - - 104(M,j) which are aligned in the column direction along the each pair of the bit lines 105a(1), 105b(1), 105a(2), 105b(2), - - - 105a(N) and 105b(N), where $1 \leq j \leq N$. Plural column selecting circuits 501(1), 501(2), - - - 501(N) are provided, so that each of the column selecting circuits 501(1), 501(2), - - - 501(N) is connected to one pair of the bit lines 105a(1), 105b(1), 105a(2), 105b(2), - - - 105a(N) and 105b(N). For example, the column selecting circuit 501(j) is connected to the one pair of the bit lines 105a(j) and 105b(j). The plural column selecting circuits 501(1), 501(2), - - - 501(N) are operated to optionally select one pair of the bit lines 105a(1), 105b(1), 105a(2), 105b(2), - - - 105a(N) and 105b(N). A sense amplifier 102 is provided which is connected with single-paired read operating common bit lines 504a and 504b which are further connected through of the plural column selecting circuits 501(1), 501(2), - - - 501(N) to the all pairs of the bit lines 105a(1), 105b(1), 105a(2), 105b(2), - - - 105a(N) and 105b(N). The sense amplifier 102 is made conductive to the selected one pair of the bit lines 105a(1), 105b(1), 105a(2), 105b(2), - - - 105a(N) and 105b(N) selected by the plural column selecting circuits 501(1), 501(2), - - - 501(N). A write driver 103 is also provided which is connected with single-paired write operation common bit lines 505a and 505b which are further connected through of the plural column selecting circuits 501(1), 501(2), - - - 501(N) to the all pairs of the bit lines 105a(1), 105b(1), 105a(2), 105b(2), - - - 105a(N) and 105b(N). The write driver 103 is also made conductive to the selected one pair of the bit lines 105a(1), 105b(1), 105a(2), 105b(2), - - - 105a (N) and 105b(N) selected by the plural column selecting circuits 501(1), 501(2), - - - 501(19. Each 501(j) of the plural column selecting circuits 501(1), 501(2), - - - 501(N) further comprises a first n-channel MOS field effect transistor MN(j), a first p-channel MOS field effect transistor MP(j), a second n-channel MOS field effect transistor MNB(j), and a second p-channel MOS field effect transistor MPB(j). The first n-channel MOS field effect transistor MN(j) is connected in series between the write operating common bit line 505a connected to the write driver 103 and one bit line 105a(j) of the selected bit lines 105a(j) and 105b(j) in the selected pair. The first n-channel MOS field effect transistor MN(j) turns ON to allow a write operation to be carried out by the write driver 103 to transmit data through the bit line 105a(j). The first p-channel MOS field effect transistor MP(j) is connected in series between the read operating common bit line 504a connected to the sense amplifier 102 and the one bit line 105a(j) of the selected bit lines 105a(j) and 105b(j) in the selected pair The first p-channel MOS field effect transistor MP(j) turns ON to allow a read operation to be carried out by the sense amplifier 102 to transmit data from the memory cell through the bit line 105a(j) to the sense amplifier 102. The second n-channel MOS field effect transistor MNB(j) is connected in series between the write operating common bit line 50b connected to the write driver 103 and another bit line 105b(j) of the selected bit lines 105a(j) and 105b(j) in the selected pair. The second n-channel MOS field effect transistor MNB(j) turns ON to allow a write operation to be carried out by the write driver 103 to transmit data through the bit line 105b(j). The second p-channel MOS field effect transistor MPB(j) is connected in series between the read operating common bit line 504b connected to the sense amplifier 102 and the other bit line 105b(j) of the selected bit lines 105a(j) and 105b(j) in the selected pair. The second p-channel MOS field effect transistor MPB(j) turns ON to allow a read operation to be carried out by the sense amplifier 102 to transmit data from the memory cell through the bit line 105b(j) to the sense amplifier 102. Read operation column selecting lines 502(1), 502(2), - - - 502(N) are provided which extend in the row direction, wherein each 502(j) of the read operation column selecting lines 502(1), 502(2), - - - 502(N) is connected to the first and second p-channel MOS field effect transistors MP(j) and MPB(j) of the corresponding column selecting circuit 501(j) One of the read operation column selecting lines 502(1), 502(2), - - - 502(N) is selected to turn ON the paired first and second p-channel MOS field effect transistors MP(j) and MPB(j), whereby the paired bit lines 105a(j) and 105b(j) are made conductive through the column selecting circuit 501(1) to the sense amplifier 102 for allowing the sense amplifier 102 to perform the reading operation. Write operation column selecting lines 503(1), 503(2), - - - 503(N) are provided which extend in the row direction, wherein each 503(j) of the write operation column selecting lines 503(1), 503(2), - - - 503(N) is connected to the first and second n-channel MOS field effect transistors MN(j) and MNB(j) of the corresponding column selecting circuit 501(j). One of the write operation column selecting lines 503(1), 503(2), - - - 503(N) is selected to turn ON the paired first and second p-channel MOS field effect transistors MN(j) and MNB(j), whereby the paired bit lines 105a(j) and 105b(j) are made conductive through the column selecting circuit 501(j) to the write driver 103 for allowing the write driver 103 to perform the writing operation.

The following description will focus on the read out operation for reading out data from the selected memory cell (i, j). The word line 106(i) is activated to cause that data of the memory cells 104(i, 1), - - - 104(i, N) connected to the activated word line 106(i) are transmitted on all pairs of the bit lines 105a(1), 105b(1), 105a(2), 105b(2), - - - 105a(N) and 105b(N). Concurrently, the read operating column selecting line 502(j) is selected to become low potential, so that the first and second p-channel MOS field effect transistors MP(j) and MPB(j) of the column selecting circuit 501(j) connected to the selected read operating column selecting line 502(j) turn ON, whereby the paired bit lines 105a(j) and 105b(j) are made electrically conducive through the read operating common bit lines 504a and 504b to the sense amplifier 102. As a result, the above data of the memory cells 104(i, 1), - - - 104(i, N) are transmitted to the sense amplifier 102. After a predetermined time has passed, then the above selected reading operation column selecting line 502(j) is placed into the non-selected state or into the high level state, so that the first and second p-channel MOS field effect transistors MP(j) and MPB(j) of the column selecting circuit 501(j) connected to the selected read operating column selecting line 502(j) turn OFF, whereby the paired bit lines 105a(j) and 105b(j) are made electrically disconnected from the read operating common bit lines 504a and 504b connected to the sense amplifier 102. The sense amplifier 102 is then activated and concurrently the word line 106(i) is inactivated. The sense amplifier 102 amplifiers a potential difference maintained by a floating capacitance between the reading operation common bit lines 504a and 504b before the sense amplifier 102 outputs an amplified result.

Subsequently, the write operation for writing data to the selected memory cell (i, j) will be described. The write operating column selecting line 503(j) is selected to become high potential, so that the first and second n-channel MOS field effect transistors MN(j) and MNB(j) of the column selecting circuit 501(j) connected to the selected write operating column selecting line 503(j) turn ON, whereby the paired bit lines 105a(j) and 105b(j) are made electrically conducive through the write operating common bit lines 505a and 505b to the write driver 103. Concurrently, the write driver 103 is activated and further one of the paired bit lines 105a(j) and 105b(j) is placed into the low potential state and, in addition, the word line 106(j) is also activated, whereby data are written to the selected memory cell 104(i, j) by the write driver 103.

The above described first conventional semiconductor memory device has a disadvantage in large hardware scale of the column selecting circuits for selecting the bit lines and the column selecting lines. It is necessary to provide the same number of the read operation column selecting lines as the number of the pairs of the bit lines for selecting one bit line pair for the read operation. It is also necessary to provide the same number of the write operation column selecting lines as the number of the pairs of the bit lines for selecting one bit line pair for the write operation.

FIG. 2 is a diagram illustrative of a second conventional semiconductor memory device. The second conventional semiconductor memory device has a (M-row×N-column) array of memory cells 104(1,1), - - - 104(1,N), - - - 104(M,1), - - - 104(M,N), wherein N and M are the natural numbers. Word lines 106(1), 106(2), - - - 106(M) extend in parallel to a row direction, wherein each of the word lines 106(1), 106(2), 106(M) is connected to the memory cells 104(i,1), 104(i,2), - - - 104(i,N) which are aligned in the row direction along the each of the word lines 106(1), 106(2), - - - 106(M), where 1≦i≦M. Plural pairs of bit lines 105a(1), 105b(1), 105a(2), 105b(2), - - - 105a(N) and 105b(N) extend in parallel to a column direction perpendicular to the row direction, wherein each pair of the bit lines 105a(1), 105b(1), 105a(2), 105b(2), - - - 105a(N) and 105b(N) is connected to the memory cells 104(1,j), 104(2,j), - - - 104(M,j) which are aligned in the column direction along the each pair of the bit lines 105a(1), 105b(j), 105a(2), 105b(2), - - - 105a(N) and 105b(N), where 1≦j≦N. Plural column selecting circuits 601(1), 601(2), 601(N) are provided, so that each of the column selecting circuits 601(1), 601(2), - - - 601(N) is connected to one pair of the bit lines 105a(1), 105b(1), 105a(2), 105b(2), - - - 105a(N) and 105b(N). For example, the column selecting circuit 601(j) is connected to the one pair of the bit lines 105a(j) and 105b(j). The plural column selecting circuits 601(1), 601(2), - - - 601(N are operated to optionally select one pair of the bit lines 105a(1), 105b(1), 105a(2), 105b(2), - - - 105a(N) and 105b(N). A sense amplifier 102 is provided which is connected with single-paired read operating common bit lines 504a and 504b which are further connected through of the plural column selecting circuits 601(1), 601(2), - - - 601(N) to the all pairs of the bit lines 105a(1), 105b(1), 105a(2), 105b(2), - - - 105a(N) and 105b(N). The sense amplifier 102 is made conductive to the selected one pair of the bit lines 105a(1), 105b(1), 105a(2), 105b(2), - - - 105a(N) and 105b(N) selected by the plural column selecting circuits 601(1), 601(2), - - - 601(N). A write driver 103 is also provided which is connected with single-paired write operation common bit lines 505a and 505b which are further connected through of the plural column selecting circuits 601(1), 601(2), - - - 601(N) to the all pairs of the bit lines 105a(1), 105b(1), 105a(2), 105b(2), - - - 105a(N) and 105b(N). The write driver 103 is also made conductive to the selected one pair of the bit lines 105a(1), 105b(1), 105a(2), 105b(2), - - - 105a(N) and 105b(N) selected by the plural column selecting circuits 601(1), 601(2), - - - 601(N). Each 601(j) of the plural column selecting circuits 601(1), 601(2), - - - 601(N) further comprises a first n-channel MOS field effect transistor MN(j), a first p-channel MOS field effect transistor MP(j), a second n-channel MOS field effect transistor MNB(j), and a second p-channel MOS field effect transistor MPB(j) as well as a NOR logic gate 606(j) and a write operation column selecting line 608(j). The first n-channel MOS field effect transistor MN(j) is connected in series between the write operating common bit line 505a connected to the write driver 103 and one bit line 105a(j) of the selected bit lines 105a(j) and 105b(j) in the selected pair. The first n-channel MOS field effect transistor MN(j) turns ON to allow a write operation to be carried out by the write driver 103 to transmit data through the bit line 105a(j). The first p-channel MOS field effect transistor MP(j) is connected in series between the read operating common bit line 504a connected to the sense amplifier 102 and the one bit line 105a(j) of the selected bit lines 105a(j) and 105b(j) in the selected pair The first p-channel MOS field effect transistor MP(j) turns ON to allow a read operation to be carried out by the sense amplifier 102 to transmit data from the memory cell through the bit line 105a(j) to the sense amplifier 102. The second n-channel MOS field effect transistor MNB(j) is connected in series between the write operating common bit line 505b connected to the write driver 103 and another bit line 105b(j) of the selected bit lines 105a(j) and 105b(j) in the selected pair. The second n-channel MOS field effect transistor MNB(j) turns ON to allow a write operation to be carried out by the write driver 103 to transmit data through the bit line 105b(j). The second p-channel MOS field effect transistor MPB(j) is connected in series between the read operating common bit line 504b connected to the sense amplifier 102 and the other bit line 105b(j) of the selected bit lines 105a(j) and 105b(j) in the selected pair. The second p-channel MOS field effect transistor MPB(j) turns ON to allow a read operation to be carried out by the sense amplifier 102 to transmit data from the memory cell through the bit line 105b(j) to the sense amplifier 102. The NOR logic gate 606(j) has an output terminal connected through the write operation column selecting line 6086) to gates of the first and second n-channel MOS field effect transistors MN(j) and MNB(j). Read operation column selecting lines 502(1), 502(2), - - - 502(N) are provided which extend in the row direction, wherein each 502(j) of the read operation column selecting lines 502(1), 502(2), - - - 502(N) is connected to the first and second p-channel MOS field effect transistors MP(j) and MPB(j) of the corresponding column selecting circuit 601(j) as well as connected to one input terminal of the NOR logic gate 606(j). One of the read operation column selecting lines 502(1), 502(2), - - - - 502(N) is selected to turn ON the paired first and second p-channel MOS field effect transistors MP(j) and MPB(j), whereby the paired bit lines 105a(j) and 105b(j) are made conductive through the column selecting circuit 601(j) to the sense amplifier 102 for allowing the sense amplifier 102 to perform the reading operation. A single write operation line 607 is provided which extend in the row direction, wherein the Single write operation line 607 is connected to another input of each the NOR logic gate 606(j) of the plural column selecting circuits 601(1), 601(2), - - - 601(N). The single write operation line 607 is placed into the low level state and further the selected read operation column selecting line 502(j) is also placed into the low level state, whereby the NOR logic gate 606(j) outputs the high level which is then transmitted through the write operation column selecting lines 608(j) to the gates of the first and second n-channel MOS field effect transistors MN(j) and MNB(j), thereby to turn ON the paired first and second p-channel MOS field effect transistors MN(j) and MNB(j), whereby the paired bit lines 105a(j) and 105b(j) are made conductive through the column selecting circuit 501(j) to the write driver 103 for allowing the write driver 103 to perform the writing operation.

The following description will focus on the read out operation for reading out data from the selected memory cell (i, j). The word line 106(i) is activated to cause that data of the memory cells 104(i, 1), - - - 104(i, N) connected to the activated word line 106(i) are transmitted on all pairs of the bit lines 105a(1), 105b(1), 105a(2), 105b(2), - - - 105a(N) and 105b(N). Concurrently, the single write operation line 607 is placed into the high level and the read operating column selecting line 502(j) is placed into the low level, so that the NOR logic gate 606(j) outputs the low level output which is transmitted to the gates of the first and second n-channel MOS field effect transistors MN(j) and MNB(j), whereby the first and second n-channel MOS field effect transistors MN(j) and MNB(j) turn OFF and the paired bit lines 105(j) are made disconnected from the write driver 103, whilst the first and second p-channel MOS field effect transistors MP(j) and MPB(j) of the column selecting circuit 601(j) connected to the selected read operating column selecting line 502(j) turn ON, whereby the paired bit lines 105a(j) and 105b(j) are made electrically conducive through the read operating common bit lines 504a and 504b to the sense amplifier 102. As a result, the above data of the memory cells 104(i, 1), - - - 104(i, N) are transmitted to the sense amplifier 102. After a predetermined time has passed, then the above selected reading operation column selecting line 502(j) is placed into the non-selected state or into the high level state, so that the first and second p-channel MOS field effect transistors MP(j) and MPB(j) of the column selecting circuit 601(j) connected to the selected read operating column selecting line 502(j) turn OFF, whereby the paired bit lines 105a(j) and 105b(j) are made electrically disconnected from the read operating common bit lines 504a and 504b connected to the sense amplifier 102. The sense amplifier 102 is then activated and concurrently the word line 106(i) is inactivated. The sense amplifier 102 amplifiers a potential difference maintained by a floating capacitance between the reading operation common bit lines 504a and 504b before the sense amplifier 102 outputs an amplified result.

Subsequently, the write operation for writing data to the selected memory cell (i, j) will be described. The single write operation line 607 is placed into the low level state and the read operation column selecting signal 502(j) is also placed in the low level state whereby the NOR logic gate 606(j) outputs a high level output which is then transmitted to the first and second n-channel MOS field effect transistors MN(j) and MNB(j), so that the first and second n-channel MOS field effect transistors MN(j) and MNB(j) of the column selecting circuit 601(j) turn ON, whereby the paired bit lines 105a(j) and 105b(j) are made electrically conducive through the write operating common bit lines 505a and 505b to the write driver 103. Further, since the read operation column selecting signal 502(j) is also placed in the low level state, the first and second p-channel MOS field effect transistors MP(j) and MPB(j) also turn ON, whereby the paired bit lines 105a(j) and 105b(j) are made electrically conducive through the read operating common bit lines 504a and 504b to the sense amplifier 102. However, the sense amplifier 102 is maintained inactive, whilst the write driver 103 is activated and further one of the paired bit lines 105a(j) and 105b(j) is placed into the low potential state and, in addition, the word line 106(j) is also activated, whereby data are written to the selected memory cell 104(i, j) by the write driver 103.

The above described second conventional semiconductor memory device has the disadvantage in large hardware scale of the column selecting circuits for selecting the bit lines and the column selecting lines. The each column selecting circuit further includes the NOR logic gate, Further, it is necessary to provide the same number of the read operation column selecting lines as the number of the pairs of the bit lines for selecting one bit line pair for the read operation.

In the above circumstances, it had been required to develop a novel semiconductor memory device free from the above problem.

SUMMARY OF THE INVENTION

Accordingly, it is an object of the present invention to provide a novel semiconductor memory device free from the above problems.

It is a further object of the present invention to provide a novel semiconductor memory device improved in high speed reading and writing operations with a reduced hardware scale necessary for column selecting operation.

The present invention provides a semiconductor memory device comprising: at least one memory cell array further comprising: a plurality of word lines; plural pairs of bit lines; plural memory cells, each of the memory cells being connected to both one of the word line and one pair of the bit lines; a same number of column selecting circuits as the pairs of bit lines so that each of the column selecting circuits is connected to corresponding one pair of the bit lines; a write driver connected in parallel to the column selecting circuits; a sense amplifier connected in parallel to the column selecting circuits and the sense amplifier being activated for read operation and being inactivated for write operation; and a same number of read/write common column selecting lines as the pairs of bit lines so that each of the read/write common column selecting lines is connected to corresponding one of the column selecting circuits; a row decoder connected to the word lines for activating one of the word lines; and a column decoder connected to the read/write common column selecting lines for activating selected one of the read/write common column selecting lines for both read and write operations.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

Figure 1:
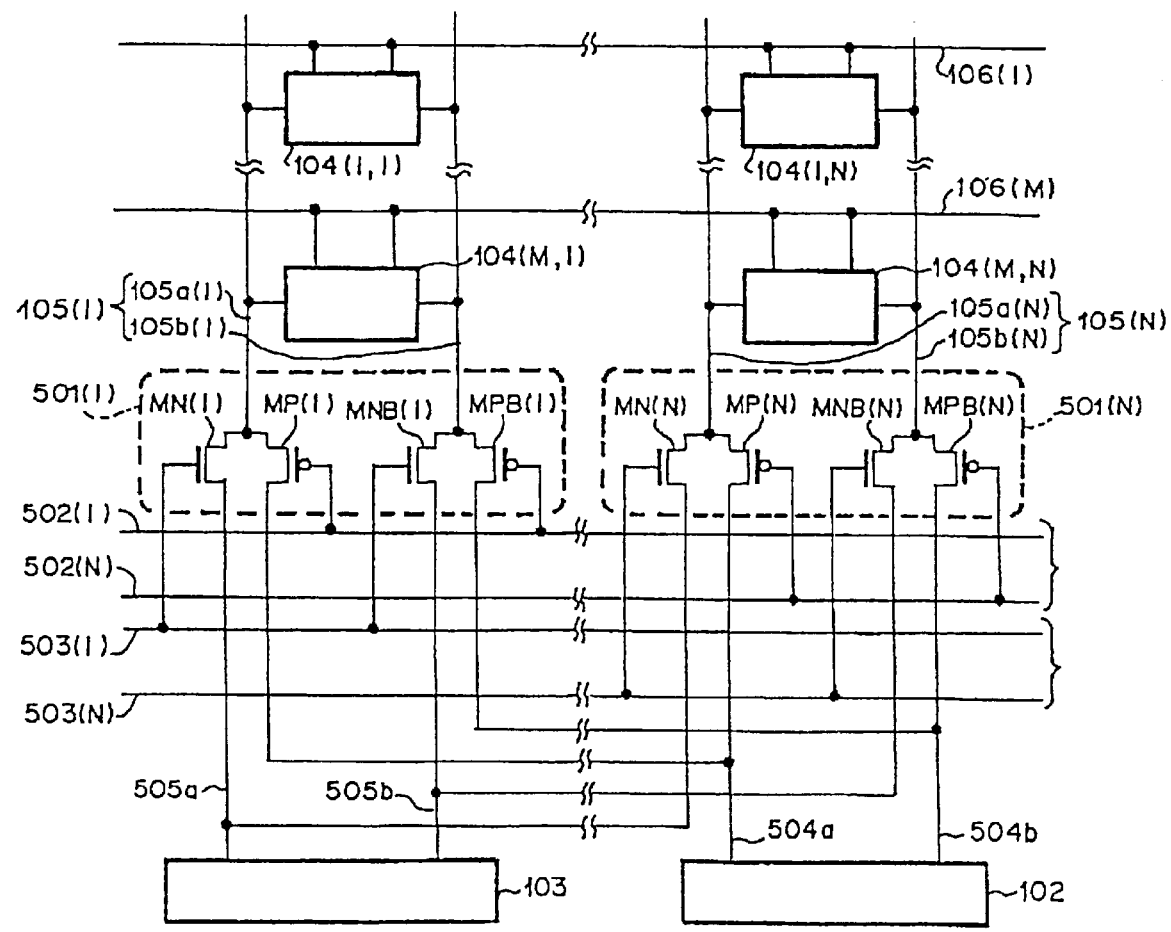
FIG. 1 is a diagram illustrative of a first conventional semiconductor memory device.
Figure 2:
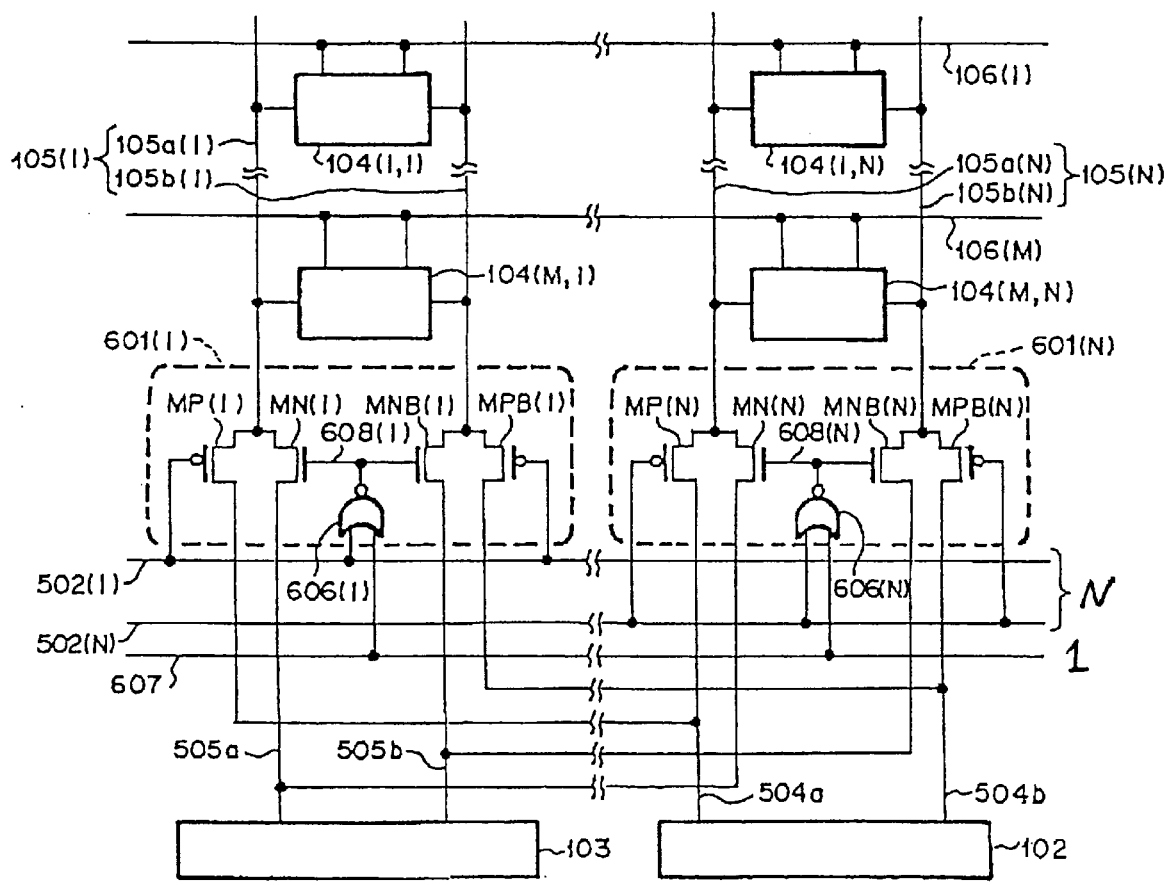
FIG. 2 is a diagram illustrative of a second conventional semiconductor memory device.
Figure 3:
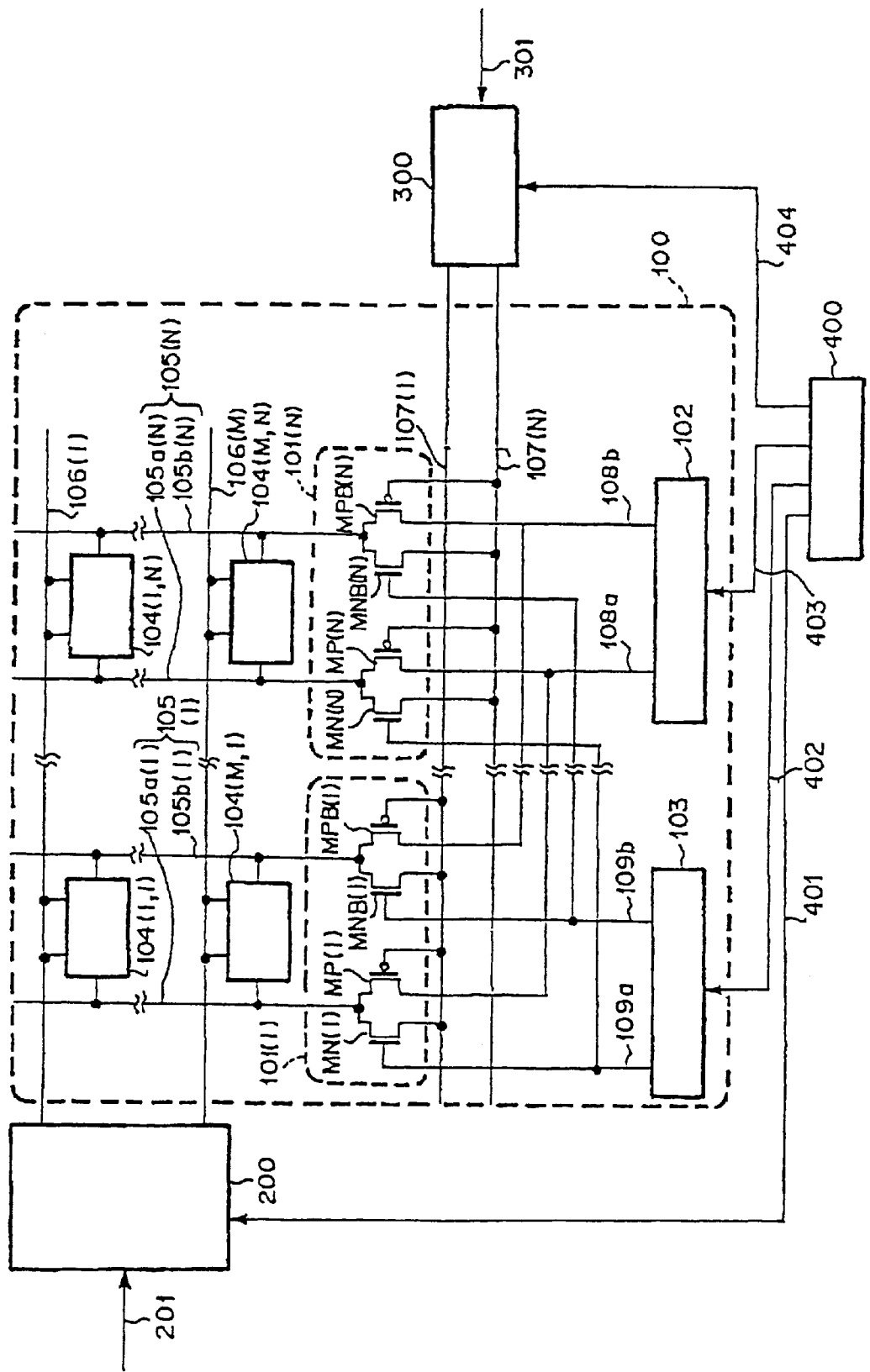
FIG. 3 is a diagram illustrative of a first novel semiconductor memory device in the first embodiment according to the present invention.

FIG, 8 is a timing chart illustrative of the write operation for writing data into the selected memory cell of the first novel semiconductor memory device of FIG. 3.

DISCLOSURE OF THE INVENTION

The present invention provides a semiconductor memory device comprising: at least one memory cell array further comprising: a plurality of word lines; plural pairs of bit lines; plural memory cells, each of the memory cells being connected to both one of the word line and one pair of the bit lines; a same number of column selecting circuits as the pairs of bit lines so that each of the column selecting circuits is connected to corresponding one pair of the bit lines; a write driver connected in parallel to the column selecting circuits; a sense amplifier connected in parallel to the column selecting circuits and the sense amplifier being activated for read operation and being inactivated for write operation; and a same number of read/write common column selecting lines as the pairs of bit lines so that each of the read/write common column selecting lines is connected to corresponding one of the column selecting circuits; a row decoder connected to the word lines for activating one of the word lines; and a column decoder connected to the read/write common column selecting lines for activating selected one of the read/write common column selecting lines for both read and write operations.

It is preferable that each of the column selecting circuits further comprises: a first field effect transistor of a first conductivity type channel being connected in series between first one of the paired bit lines and corresponding one of the column selecting lines, and the first field effect transistor having a gate connected to the write driver; a second field effect transistor of a second conductivity type channel being connected in series between the first one of the paired bit lines and the sense amplifier, and the second field effect transistor having a gate connected to the corresponding one of the column selecting lines; a third field effect transistor of a first conductivity type channel being connected in series between second one of the paired bit lines and the corresponding one of the column selecting lines, and the first field effect transistor having a gate connected to the write driver; and a fourth field effect transistor of a second conductivity type channel being connected in series between the second one of the paired bit lines and the sense amplifier, and the second field effect transistor having a gate connected to the corresponding one of the column selecting lines.

The novel semiconductor memory device has advantage in reduction to hardware scale for selecting the bit lines and the column selecting lines. Namely, the column selecting lines are commonly used for both the read and write operations in order to reduce the number of the column selecting lines. Further, the number of the necessary transistors for each of the column selecting circuits is reduced to four, whilst the second conventional circuit configuration needs eight transistors for each column selecting circuit.

It is also preferable to further comprise a controller connected to the row decoder and the column decoder for controlling the row decoder and the column decoder, so that the controller renders the row decoder and the column decoder respectively activate the word line and the column selecting line concurrently In this case, it is further preferable that the controller is further connected to the sense amplifier for controlling the sense amplifier so that the controller renders the column decoder inactivate the activated column selecting line before the controller activates the sense amplifier.

It is also preferable that the controller renders the row decoder and the column decoder respectively inactivate the word line and the column selecting line concurrently.

It is also preferable that the controller renders the column decoder inactivate the column selecting line before the controller renders the row decoder inactivate the word line.

It is also preferable that the controller is further connected to the write driver for controlling the write driver, and the write driver is connected with a pair of write operation common bit lines which are also connected in parallel to each of the column selecting circuits.

It is further preferable that the write driver places first one of the paired write operation common bit lines into low level and also places second one thereof into high level.

It is also preferable that first one of the paired bit lines is placed in low level and second one of the paired bit lines is fixed at high level.

It is also preferable that the sense amplifier comprises a latch sense amplifier. The latch sense amplifier may comprise: a first MOS field effect transistor of a second conductivity type channel connected in series to a power line; a second MOS field effect transistor of a second conductivity type channel connected in series to the power line and in parallel to the first MOS field effect transistor; a third MOS field effect transistor of a first conductivity type channel connected in series to the first MOS field effect transistor, and the third MOS field effect transistor having a gate connected to a gate of the first MOS field effect transistor; a fourth MOS field effect transistor of a first conductivity type channel connected in series to the second MOS field effect transistor, and the fourth MOS field effect transistor having a gate connected to a gate of the second MOS field effect transistor; a fifth MOS field effect transistor of a first conductivity type channel connected in series between a ground line and both the third and fourth MOS field effect transistors, and the fifth MOS field effect transistor having a gate connected to an activation signal line; a first input/output line connected to an intermediate point between the first and third MOS field effect transistors and also connected to the gates of the second and fourth MOS field effect transistors; and a second input/output line connected to an intermediate point between the second and fourth MOS field effect transistors and also connected to the gates of the first and third MOS field effect transistors.

It is also preferable that the sense amplifier comprises a differential sense amplifier. The latch sense amplifier may comprise a first MOS field effect transistor of a second conductivity type channel connected in series to a power line; a second MOS field effect transistor of a second conductivity type channel connected in series to the power line and in parallel to the first MOS field effect transistor; a third MOS field effect transistor of a first conductivity type channel connected in series to the first MOS field effect transistor, and an intermediate point between the first and third MOS field effect transistors being connected to a gate of the second MOS field effect transistor; a fourth MOS field effect transistor of a first conductivity type channel connected in series to the second MOS field effect transistor; a fifth MOS field effect transistor of a first conductivity type channel connected in series between a ground line and both the third and fourth MOS field effect transistors, and the fifth MOS field effect transistor having a gate connected to an activation signal line; an output line connected to an intermediate point between the second and fourth MOS field effect transistors; a first input line connected to a gate of the third MOS field effect transistor; a second input line connected to a gate of he fourth MOS field effect transistor; a sixth MOS field effect transistor of a first conductivity type channel being connected in series between the power line and the first input line; a seventh MOS field effect transistor of a first conductivity type channel being connected in series between the power line and the second input line; a first inverter having an output terminal connected to a gate of the sixth MOS field effect transistor and an input terminal connected to first one of paired write operation common bit lines connected to the write driver ;and a second inverter having an output terminal connected to a gate of the seventh MOS field effect transistor and an input terminal connected to second one of paired write operation common bit lines connected to the write driver.

PREFERRED EMBODIMENT

A first embodiment according to the present invention will be described in detail with reference to the drawings. FIG. 3 is a diagram illustrative of a first novel semiconductor memory device in the first embodiment according to the present invention. The first novel semiconductor memory device has a memory array 100, a row decoder 200 connected to the memory array 100, a column decoder 300 connected to the memory array 100, and a controller 400 connected to the memory array 100. The memory array 100 has a (M-row×N-column) array of memory cells 104(1,1), - - - 104(1,N), - - - 104(M,1), - - - 104(M,N), wherein N and M are the natural numbers. Word lines 106(1), 106(2), - - - 106(M) extend in parallel to a row direction, wherein each of the word lines 106(1), 106(2), - - - 106(M) is connected to the memory cells 104(i,1), 104(i,2), - - - 104(i,N) which are aligned in the row direction along the each of the word lines 106(1), 106(2), 106(M), where $1 \leq i \leq M$. The word lines 106(1), 106(2), - - - 106(M) are also connected to the row decoder 200. Plural pairs of bit lines 105a(1), 105b(1), 105a(2), 10b(2), - - - 105a(N) and 105b(N) extend in parallel to a column direction perpendicular to the row direction, wherein each pair of the bit lines 105a(1), 105b(1), 105a(2), 105b(2), - - - 105a(N) and 105b(N) is connected to the memory cells 104(1,j), 104(2,j), - - - 104(M,j) which are aligned in the column direction along the each pair of the bit lines 105a(1), 105b(1), 105a(2), 105b(2), - - - 105a(N) and 105b(N), where $1 \leq j \leq N$. Plural column selecting circuits 101(1), 101(2), - - - 101(N) arc provided, so that each of the column selecting circuits 101(1), 101(2), - - - 101(N) is connected to one pair of the bit lines 105a(1), 105b(1), 105a(2), 105b(2), - - - 105a(N) and 105b(N). For example, the column selecting circuit 101(j) is connected to the one pair of the bit lines 105a(j) and 105b(j). The plural column selecting circuits 101(1), 101(2), - - - 101(N) are operated to optionally select one pair of the bit lines 105a(1), 105b(1), 105a(2), 105b(2), - - - 105a(N) and 105b(N). A sense amplifier 102 is provided which is connected with single-paired read operating common bit lines 108a and 108b which are further connected through of the plural column selecting circuits 101(1), 101(2), - - - 101(N) to the all pairs of the bit lines 105a(1), 105b(1), 105a(2), 105b(2), - - - 105a(N) and 105b(N). The sense amplifier 102 is made conductive to the selected one pair of the bit lines 105a(1), 105b(1), 105a(2), 105b(2), - - - 105a(N) and 105b(N) selected by the plural column selecting circuits 101(1), 101(2), - - - 101(N). A write driver 103 is also provided which is connected with single-paired write operation common bit lines 109a and 109b which are further connected through of the plural column selecting circuits 101(1), 101(2), - - - 101(N) to the all pairs of the bit lines 105a(1), 105b(1), 105a(2), 105b(2), - - - 105a(N) and 105b(N). The write driver 103 is also made conductive to the selected one pair of the bit lines 105a(1), 105b(1), 105a(2), 105b(2), - - - 105a(N) and 105b(N) selected by the plural column selecting circuits 101(1), 101(2), - - - 101(N). Each 101(j) of the plural column selecting circuits 101(1), 101(2), - - - 101(N) further comprises a first n-channel MOS field effect transistor MN(j), a first p-channel MOS field effect transistor MP(j), a second n-channel MOS field effect transistor MNB(j), and a second p-channel MOS field effect transistor MPB(j). The first n-channel MOS field effect transistor MN(j) is connected in series between the write operating common bit line 109a connected to the write driver 103 and one bit line 105a(j) of the selected bit lines 105a(j) and 105b(j) in the selected pair. The first n-channel MOS field effect transistor MN(j) turns ON to allow a write operation to be carried out by the write driver 103 to transmit data through the bit line 105a(j). The first p-channel MOS field effect transistor MP(j) is connected in series between the read operating common bit line 108a connected to the sense amplifier 102 and the one bit line 105a(j) of the selected bit lines 105a(j) and 105b(j) in the selected pair. The first p-channel MOS field effect transistor MP(j) turns ON to allow a read operation to be carried out by the sense amplifier 102 to transmit data from the memory cell through the bit line 105a(j) to the sense amplifier 102. The second n-channel MOS field effect transistor MNB(j) is connected in series between the write operating common bit line 109b connected to the write driver 103 and another bit line 105b(j) of the selected bit lines 105a(j) and 105b(j) in the selected pair. The second n-channel MOS field effect transistor MNB(j) turns ON to allow a write operation to be carried out by the write driver 103 to transmit data through the bit line 105b(j). The second p-channel MOS field effect transistor MPB(j) is connected in series between the read operating common bit line 108b connected to the sense amplifier 102 and the other bit line 105b(j) of the selected bit lines 105a(j) and 105b(j) in the selected pair. The second p-channel MOS field effect transistor MPB(j) turns ON to allow a read operation to be carried out by the sense amplifier 102 to transmit data from the memory cell through the bit line 105b(j) to the sense amplifier 102. Column selecting lines 107(1), 107(2), - - - 107(N) are provided which extend in the row direction, wherein the column selecting lines 107(1), 107(2), - - - 107(N) are connected to the column decoder 300, Each 107(j) of the column selecting lines 107(1), 107(2), - - - 107(N) is connected to the first and second n-channel MOS field effect transistors MN(j) and MNB(j) of the corresponding column selecting circuit 101(j) as well as connected to gates of the first and second p-channel MOS field effect transistors MP(j) and MPB(j) of the corresponding column selecting circuit 101(j). One of the column selecting lines 107(1), 107(2), - - - 107(N) is selected by the column decoder 300 to turn ON the paired first and second p-channel MOS field effect transistors MP(j) and MPB(j), whereby the paired bit lines 105a(j) and 105b(j) are made conductive through the column selecting circuit 101(j) to the sense amplifier 102 for allowing the sense amplifier 102 to perform the reading operation. One of the column selecting lines 107(1), 107(2), - - - 107(N) is also selected by the column decoder 300 to turn ON the paired first and second n-channel MOS field effect transistors MN(j) and MNB(j), whereby the paired bit lines 105a(j) and 105b(j) are made conductive through the column selecting circuit 101(j) to the write driver 103 for allowing the write driver 103 to perform the write operation. The row decoder 200 receives an input of encoded row address 201 for decoding the row address 201 so that the row decoder 200 activates one of the word lines 106(1), - - - 106(N) in accordance with the decoded row address 201. The column decoder 300 receives an input of encoded column address 301 to decode the column address 301 so that the column decoder 300 activates one of the column selecting lines 107(1), - - - 107(N) in accordance with the decoded column address 301. The controller 400 is connected through a row decoder control line 401 to the row decoder 200 for controlling the row decoder 200. The controller 400 is also connected through a write driver control line 402 to the write driver 103 for controlling the write driver 103. The controller 400 is also connected through a sense amplifier control line 403 to the sense amplifier 102 for controlling the sense amplifier 102. The controller 400 is connected through a column decoder control line 404 to the column decoder 300 for controlling the column decoder 300.

Figure 4:
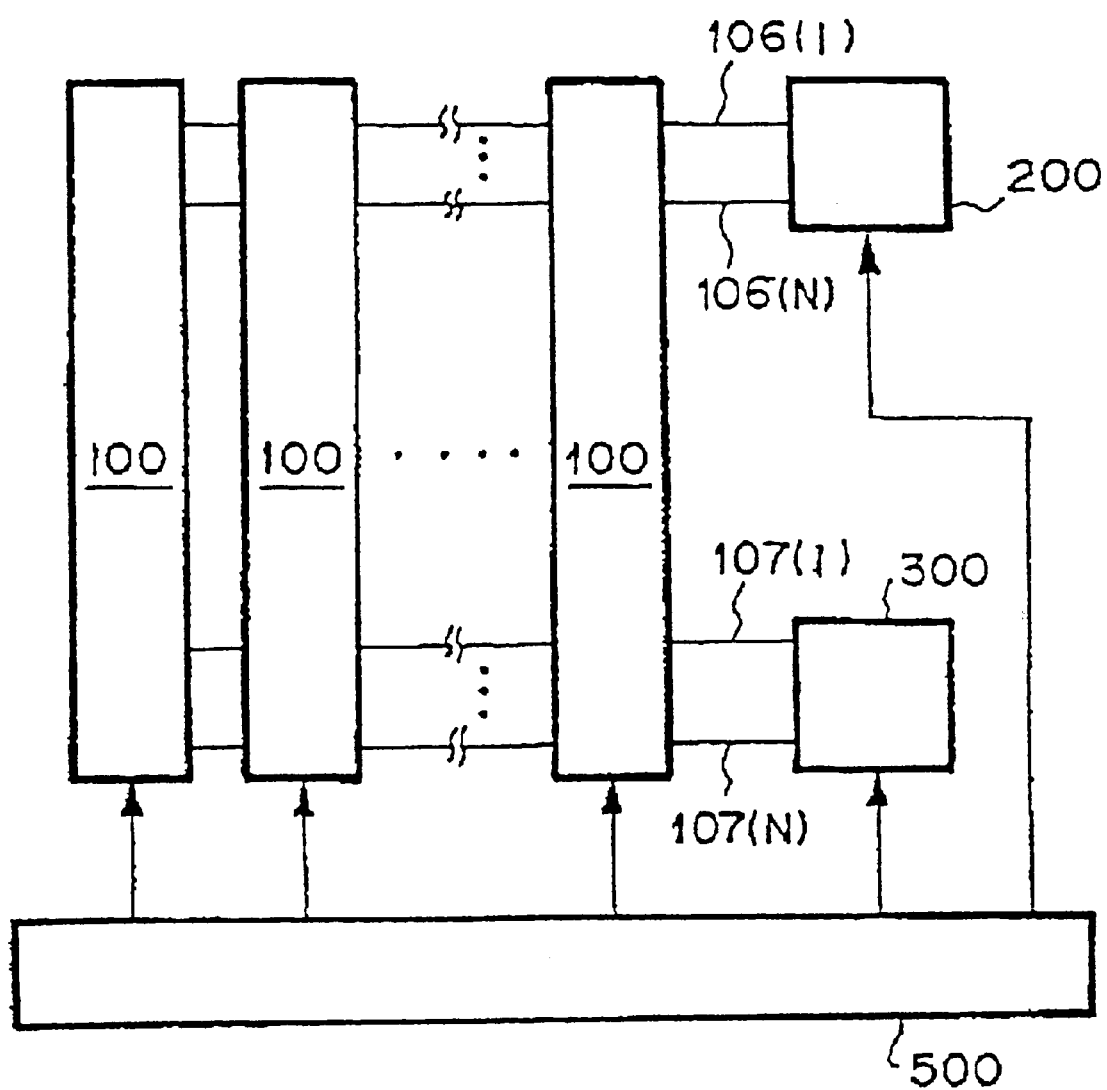
FIG. 4 is a schematic block diagram illustrative of a modified circuit configuration to the semiconductor memory device of FIG. 3.
Figure 5:
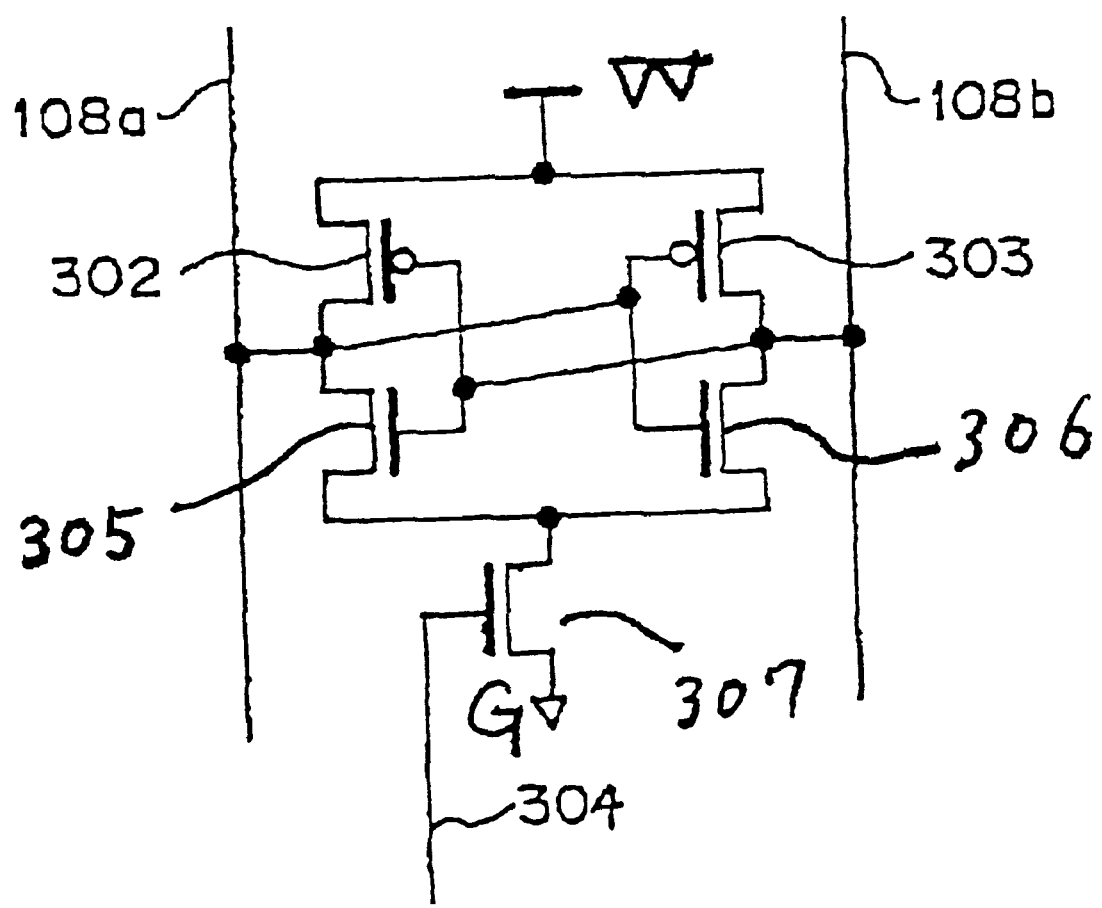
FIG. 5 is a circuit diagram illustrative of a first preferable circuit configuration of the sense amplifier in the memory array of the first novel semiconductor memory device of FIG. 3.

FIG. 4 is a schematic block diagram illustrative of a modified circuit configuration to the semiconductor memory device of FIG. 3. The modified semiconductor memory device comprises a plurality of memory arrays 100, a row decoder 200, a column decoder 300 and a controller 500. Each of the memory arrays 100 extends in the column direction, and the plural memory arrays 100 are aligned in the row direction. Each of the memory arrays has plural memory cells, word lines and bit lines as well as the same number of column selecting circuits as the number of pairs of the bit lines, and a single sense amplifier and a single write driver. The circuit configuration of each of the plural memory arrays 100 of FIG. 4 is basically the same as of FIG. 3. The row decoder 200 is connected to the word lines 106(1), - - - 106(N) for activating one of the word lines 106(1), - - - 106(N). The column decoder 300 is also connected to the column selecting lines 107(1), - - - 107(N) for activating one of the column selecting lines 107(1), - - - 107(N). The controller 500 is connected to the row decoder 200 for controlling the row decoder 200. The controller 500 is also connected to the column decoder 300 for controlling the column decoder 300. The controller 500 is also connected to the sense amplifier and the write driver in each of the plural memory arrays 100. It is possible that the controller 500 sends or allocates the same or different address bits to the individual memory arrays 100 to individually control the activation of the memory arrays 100, FIG. 5 is a circuit diagram illustrative of a first preferable circuit configuration of the sense amplifier in the memory array of the first novel semiconductor memory device of FIG. 3. The first preferable circuit configuration of the sense amplifier 102 is of a latch type sense amplifier, which utilizes the single-paired read operating common bit lines 108a and 108b as a pair of input/output lines. This latch type sense amplifier is activated by high level of an activation signal line 304. The circuit of the latch type sense amplifier is provided between a power line W and a ground line G. The circuit of the latch type sense amplifier comprises first and second p-channel MOS field effect transistors 302 and 303 and first, second and third n-channel MOS field effect transistors 305, 306 and 307. The activation signal line 304 is connected to a gate of the third n-channel MOS field effect transistor 307. The first p-channel MOS field effect transistor 302 and the first n-channel MOS field effect transistor 305 are connected in series, wherein a gate of the first p-channel MOS field effect transistor 302 is connected to a gate of the first n-channel MOS field effect transistor 305, The first p-channel MOS field effect transistor 302 is connected in series to the power line W. The third n-channel MOS field effect transistor 307 is also connected in series to the ground line G. The first n-channel MOS field effect transistor 305 is connected in series between the first p-channel MOS field effect transistor 302 and the third n-channel MOS field effect transistor 307. An intermediate point between the first p-channel MOS field effect transistor 302 and the first n-channel MOS field effect transistor 305 is connected to the input/output line 108a. The second p-channel MOS field effect transistor 303 and the second n-channel MOS field effect transistor 306 are connected in series, wherein a gate of the second p-channel MOS field effect transistor 303 is connected to a gate of the second n-channel MOS field effect transistor 306, The second p-channel MOS field effect transistor 303 is connected in series to the power line W. The second n-channel MOS field effect transistor 306 is connected in series between the second p-channel MOS field effect transistor 303 and the third n-channel MOS field effect transistor 307. An intermediate point between the second p-channel MOS field effect transistor 303 and the second n-channel MOS field effect transistor 306 is connected to the input/output line 108b. The gates of the first p-channel and n-channel MOS field effect transistors 302 and 305 are connected to the intermediate point between the second p-channel and n-channel MOS field effect transistors 303 and 306 and also connected to the input/output line 108b The gates of the second p-channel and n-channel MOS field effect transistors 303 and 306 are connected to the intermediate point between the first p-channel and n-channel MOS field effect transistors 302 and 305 and also connected to the input/output line 108a. The latch circuit comprises the first and second p-channel MOS field effect transistors 302 and 303 and the first and second n-channel MOS field effect transistors 305 and 306. When the activation signal line 304 is placed in the high level to turn the third n-channel MOS field effect transistor 307 ON to bias the latch circuit between the power line W and the ground line G, then the sense amplifier is activated.

Figure 6:
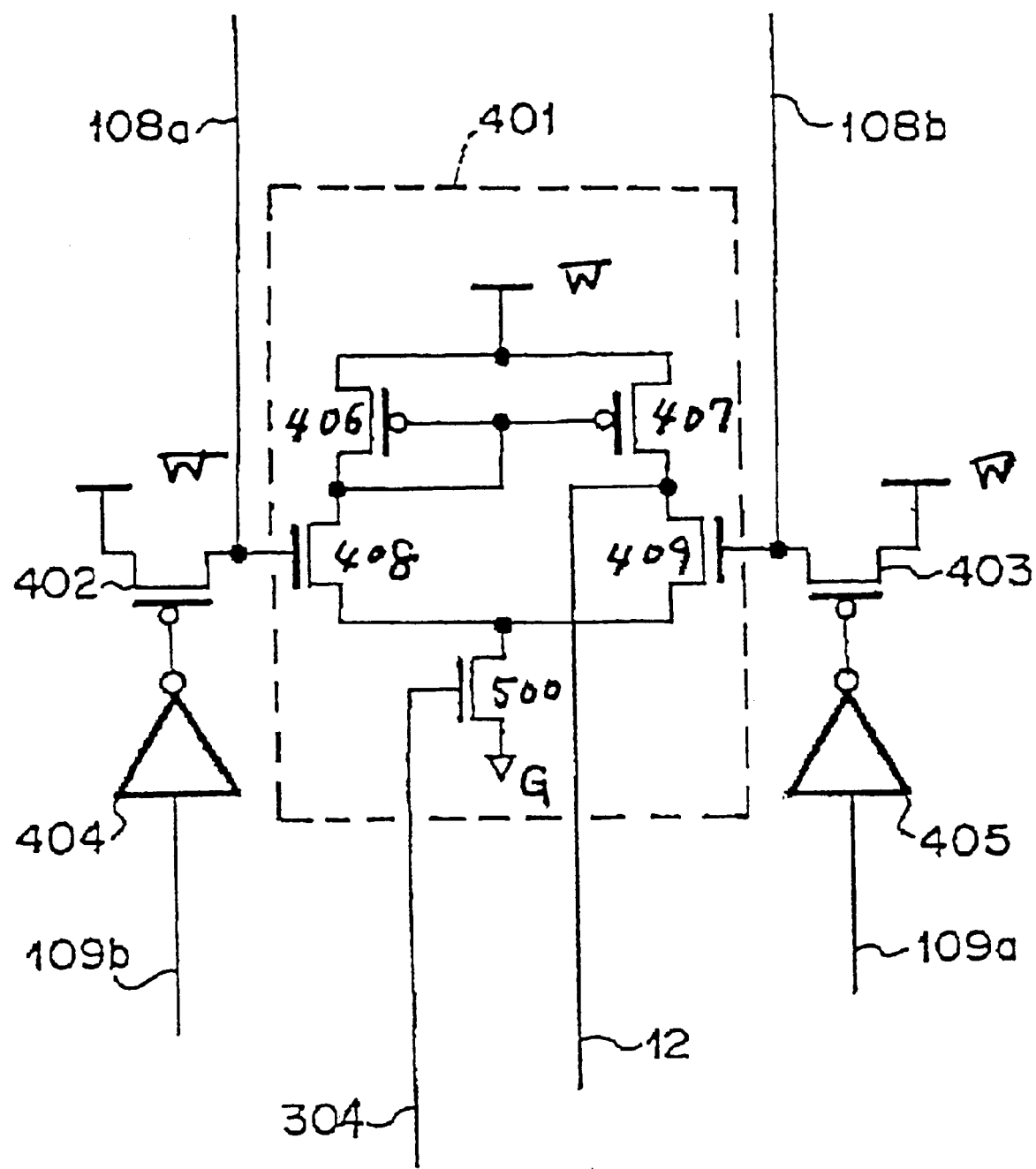
FIG. 6 is a circuit diagram illustrative of a second preferable circuit configuration of the sense amplifier in the memory array of the first novel semiconductor memory device of FIG. 3.

FIG. 6 is a circuit diagram illustrative of a second preferable circuit configuration of the sense amplifier in the memory array of the first novel semiconductor memory device of FIG. 3. The second preferable circuit configuration of the sense amplifier 102 is activated by high level of an activation signal line 304. The second preferable circuit configuration of the sense amplifier 102 is also provided between a power line W and a ground line G. The second preferable circuit configuration of the sense amplifier 102 is of a differential sense amplifier type.

The circuit of the differential sense amplifier comprises a sense amplifier 401, a pair of first and second input lines 108a and 108b, first and second inverters 404 and 405, first and second power switching p-channel MOS field effect transistors 402 and 403 and an output line 12. The first and second input lines 108a and 108b comprises the single-paired read operating common bit lines 108a and 108b shown in FIG. 3. The sense amplifier 401 further comprises first and second p-channel MOS field effect transistors 406 and 407 and first, second and third n-channel MOS field effect transistors 408, 409 and 500. The activation signal line 304 is connected to a gate of the third n-channel MOS field effect transistor 500. The first p-channel MOS field effect transistor 406 and the first n-channel MOS field effect transistor 408 are connected in series to each other, wherein a gate of the first p-channel MOS field effect transistor 406 is connected to a gate of the second p-channel MOS field effect transistor 407. The first p-channel MOS field effect transistor 406 is connected in series to the power line W. The third n-channel MOS field effect transistor 500 is also connected in series to the ground line G. The first n-channel MOS field effect transistor 408 is connected in series between the first p-channel MOS field effect transistor 406 and the third n-channel MOS field effect transistor 500. An intermediate point between the first p-channel MOS field effect transistor 406 and the first n-channel MOS field effect transistor 408 is also connected to the gates of the first and second p-channel MOS field effect transistors 408 and 409. The second p-channel MOS field effect transistor 407 and the second n-channel MOS field effect transistor 409 are connected in series to each other. The second p-channel MOS field effect transistor 407 is connected in series to the power line W. The second n-channel MOS field effect transistor 409 is connected in series between the second p-channel MOS field effect transistor 407 and the third n-channel MOS field effect transistor 500, An intermediate point between the second p-channel MOS field effect transistor 407 and the second n-channel MOS field effect transistor 409 is connected to the output line. The gate of the first n-channel MOS field effect transistor 408 is connected to the first input line 108a. The gate of the second n-channel MOS field effect transistor 409 is connected to the second input line 108b. The first power switching n-channel MOS field effect transistor 402 is connected in series between the power line W and the gate of the first n-channel MOS field effect transistor in the differential sense amplifier 401. A gate of the first power switching n-channel MOS field effect transistor 402 is connected to an output terminal of the first inverter 404. An input terminal of the first inverter 404 is connected to the write operation common bit line 109b shown in FIG. 3. The first power switching n-channel MOS field effect transistor 402 switches to connect and disconnect the first input line 108a to and from the power line W based on the inverted output signal from the H write driver 103 shown in FIG. 3. The second power switching n-channel MOS field effect transistor 403 is connected in series between the power line W and the gate of the second n-channel MOS field effect transistor 409 in the differential sense amplifier 401. A gate of the second power switching n-channel MOS field effect transistor 403 is connected to an output terminal of the second inverter 405. An input terminal of the second inverter 405 is connected to the write operation common bit line 109b shown in FIG. 3. The second power switching n-channel MOS field effect transistor 403 switches to connect and disconnect the second input line 108b to and from the power line W based on the inverted output signal from the write driver 103 shown in FIG. 3. The above differential sense amplifier is activated by placing the activation signal line into the high level state and outputs the valid logical value.

Figure 7:
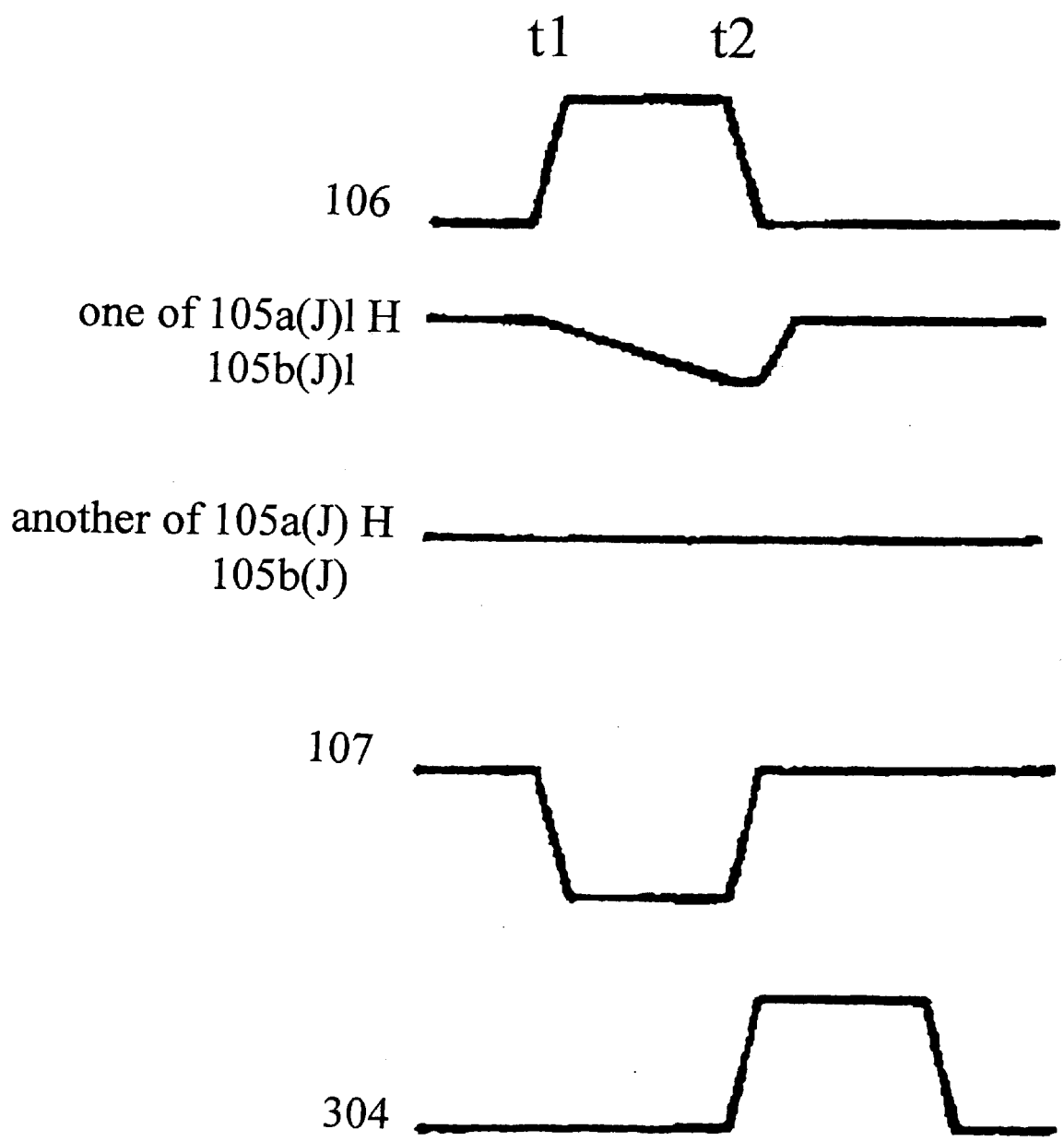
FIG. 7 is a timing chart illustrative of the read out operation for reading out data from the selected memory cell of the first novel semiconductor memory device of FIG. 3.

The following description will focus on the read out operation for reading out data from the selected memory cell (i, j). FIG. 7 is a timing chart illustrative of the read out operation for reading out data from the selected memory cell of the first novel semiconductor memory device of FIG. 3. At a time "t1", the word line 106(i) is activated or becomes high level to cause that data of the memory cells 104(i, 1), - - - 104(i, N) connected to the activated word line 106(i) are transmitted on all pairs of the bit lines 105a(1), 105b(1), 105a(2), 105b(2), - - - 105a(N) and 105b(N). Concurrently, the column selecting line 107(j) is activated by the column decoder 300 to become low potential, so that the first and second p-channel MOS field effect transistors MP(j) and MPB(j) of the column selecting circuit 101(j) connected to the activated column selecting line 107(j) turn ON, whereby the paired bit lines 105a(j) and 105b(j) are made electrically conducive through the read operating common bit lines 108a and 108b to the sense amplifier 102. As a result, the above data of the memory cells 104(i, 1), - - - 104(i, N) are transmitted to the sense amplifier 102. At a time "t2", the above activated column selecting line 107(j) is inactivated or placed into the high level state, so that the first and second p-channel MOS field effect transistors MP(j) and MPB(j) of the column selecting circuit 101(j) connected to the inactivated column selecting line 107(j) turn OFF, whereby the paired bit lines 105a(j) and 105b(j) are made electrically disconnected from the read operating common bit lines 108a and 108b connected to the sense amplifier 102. The controller 400 activates the activation signal line 304 to place the activation signal line 304 into the high level state, whereby the sense amplifier 102 is then activated. Further, at the time "t2", the word line 106(i) is inactivated by the row decoder 200. It is, however, possible that the word line 106(i) is inactivated by the row decoder 200 but after the time "t2". The sense amplifier 102 amplifiers a potential difference maintained by a floating capacitance between the reading operation common bit lines 108a and 108b before the sense amplifier 102 outputs an amplified result.

Figure 8:
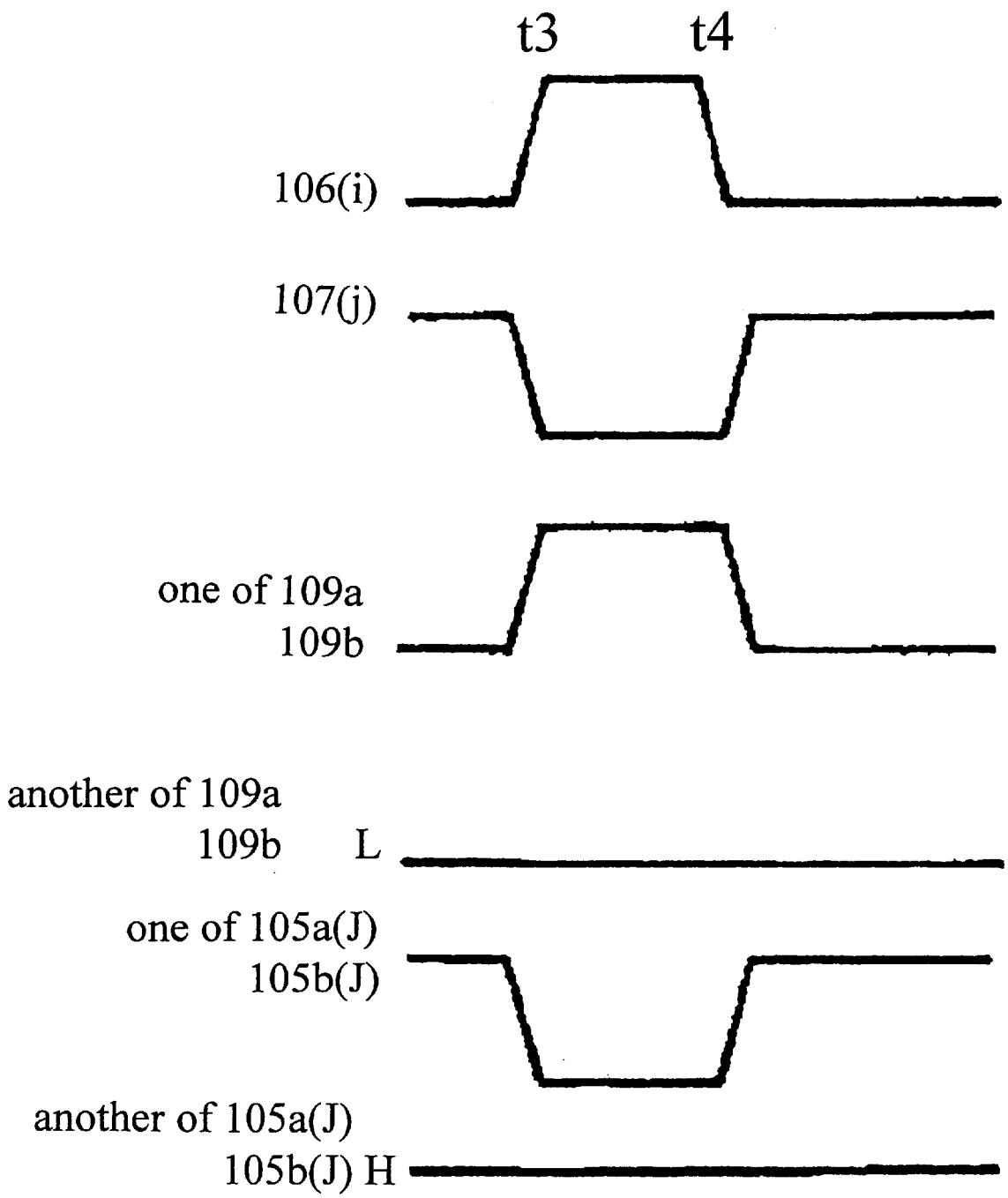

Subsequently, the write operation for writing data to the selected memory cell (i, j) will be described. FIG. 8 is a timing chart illustrative of the write operation for writing data into the selected memory cell of the first novel semiconductor memory device of FIG. 3. At a time "t3", the column selecting line 107(j) is activated by the column decoder 300 to become low potential, so that sources of the first and second n-channel MOS field effect transistors MN(j) and MNB(j) of the column selecting circuit 101(j) become low potential. The write driver 103 causes that one of the write operation common bit lines 109a and 109b which accords to the logic level of the writing data is placed into the high level, whereby one of the first and second n-channel MOS field effect transistors MN(j) and MNB(j) of the column selecting circuit 101(j), which is connected to the low level one of the write operation common bit lines 109a and 109b, turns ON. If the first n-channel MOS field effect transistor MN(j) turns ON, then the bit line 105a(j) is changed from the high level to the low level, whilst the bit line 105b(j) is maintained in high level. If the second n-channel MOS field effect transistor MNB(j) turns ON, then the bit line 105b(j) is changed from the high level to the low level, whilst the bit line 105a(j) is maintained in high level. At a time "t3", the row decoder 200 activates the word line (i) to place the word line (i) in the high potential for carrying out the write operation for writing data to the memory cell (i, j). At a time "t4", the write operation is completed, and then the write driver 103, the row decoder 200 and the column decoder 300 inactivate the signal lines.

During the above write operation, the activation signal line 304 of the sense amplifier 102 is maintained to be inactivated, so that even the first and second p-channel MOS field effect transistors MP(j) and MPB(j) turn ON, no influence is given to the above operations of placing one of the bit lines 105a and 105b into the low level.

The use of one of the sense amplifiers shown in FIGS. 5 and 6 fixes the other one, at high level, of the bit lines 105a and 105b than one placed into the low level, whereby one of the paired bit lines 105a and 105b is supplied with the low potential, whilst the other one thereof is supplied with the high level to make the write operation stable.

In the latch type sense amplifier shown in FIG. 5, one of the input/output lines 108a and 108b is placed into the low level, so that one of the first and second p-channel MOS field effect transistors 302 and 303 connected to the low level one of the input/output lines 108a and 108b turns ON. Another of the input/output lines 108a and 108b is placed into the high level, so that another of the first and second p-channel MOS field effect transistors 302 and 303 connected to the high level one of the input/output lines 108a and 108b turns OFF. Concurrently, the first and second p-channel MOS field effect transistors MP(j) and MPB(j) connected to the selected paired bit lines 105a(j) and 105b(j) turn ON, so that one of the paired bit lines 105a(j) is placed into the low level whilst another of the paired bit lines 105a(j) is placed into the high level.

In the differential sense amplifier shown in FIG. 6, the logic levels of the write operation common bit lines 109a and 109b are inverted by the first and second inverters 404 and 405 before the inverted signal is inputted into the gates of the first and second power switching p-channel MOS field effect transistors 402 and 403. Namely, if the write operation common bit line 109a is high level, then the input line 108b is fixed at high level. If the write operation common bit line 109b is high level, then the input line 108a is fixed at high level. Concurrently, the first and second p-channel MOS field effect transistors MP(j) and MPB(j) turn ON, so that one of the paired bit lines 105a(j) is placed into the low level whilst another of the paired bit lines 105a(j) is placed into the high level.

As a modification, it is possible that the conductivity type channels of the channel of the MOS field effect transistors are inverted.

The above described novel semiconductor memory device has advantage in reduction to hardware scale for selecting the bit lines and the column selecting lines. Namely, the column selecting lines are commonly used for both the read and write operations in order to reduce the number of the column selecting lines. Further, the number of the necessary transistors for each of the column selecting circuits is reduced to four, whilst the second conventional circuit configuration needs eight transistors for each column selecting circuit.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor memory device comprising:
   at least one memory cell array further comprising:
      a plurality of word lines;
      plural pairs of bit lines;
      plural memory cells, each of said memory cells being connected to both one of said word line and one pair of said bit lines;
      a same number of column selecting circuits as said pairs of bit lines so that each of said column selecting circuits is connected to corresponding one pair of said bit lines;
      a write driver connected in parallel to said column selecting circuits;
      a sense amplifier connected in parallel to said column selecting circuits and said sense amplifier being activated for read operation and being inactivated for write operation; and
      a same number of read/write common column selecting lines as said pairs of bit lines so that each of said read/write common column selecting lines is connected to corresponding one of said column selecting circuits;
   a row decoder connected to said word lines for activating one of said word lines; and
   a column decoder connected to said read/write common column selecting lines for activating selected one of said read/write common column selecting lines for both read and write operations.

2. The semiconductor memory device as claimed in claim 1, wherein each of said column selecting circuits further comprises:
   a first field effect transistor of a first conductivity type channel being connected in series between first one of said paired bit lines and corresponding one of said column selecting lines, and said first field effect transistor having a gate connected to said write driver;
   a second field effect transistor of a second conductivity type channel being connected in series between said first one of said paired bit lines and said sense amplifier, and said second field effect transistor having a gate connected to said corresponding one of said column selecting lines;
   a third field effect transistor of a first conductivity type channel being connected in series between second one of said paired bit lines and said corresponding one of said column selecting lines, and said first field effect transistor having a gate connected to said write driver; and
   a fourth field effect transistor of a second conductivity type channel being connected in series between said second one of said paired bit lines and said sense amplifier, and said second field effect transistor having a gate connected to said corresponding one of said column selecting lines.

3. The semiconductor memory device as claimed in claim 1, further comprising a controller connected to said row decoder and said column decoder for controlling said row decoder and said column decoder, so that said controller renders said row decoder and said column decoder respectively activate said word line and said column selecting line concurrently.

4. The semiconductor memory device as claimed in claim 3, wherein said controller is further connected to said sense amplifier for controlling said sense amplifier so that said controller renders said column decoder inactivate said activated column selecting line before said controller activates said sense amplifier.

5. The semiconductor memory device as claimed in claim 3, wherein said controller renders said row decoder and said column decoder respectively inactivate said word line and said column selecting line concurrently.

6. The semiconductor memory device as claimed in claim 3, wherein said controller renders said column decoder inactivate said column selecting line before said controller renders said row decoder inactivate said word line.

7. The semiconductor memory device as claimed in claim 3, wherein said controller is further connected to said write driver for controlling said write driver, and said write driver is connected with a pair of write operation common bit lines which are also connected in parallel to each of said column selecting circuits.

8. The semiconductor memory device as claimed in claim 7, wherein said write driver places first one of said paired write operation common bit lines into low level and also places second one thereof into high level.

9. The semiconductor memory device as claimed in claim 7, wherein first one of said paired bit lines is placed in low level and second one of said paired bit lines is fixed at high level.

10. The semiconductor memory device as claimed in claim 1, wherein said sense amplifier comprises a latch sense amplifier.

11. The semiconductor memory device as claimed in claim 10, wherein said latch sense amplifier comprises:

a first MOS field effect transistor of a second conductivity type channel connected in series to a power line;

a second MOS field effect transistor of a second conductivity type channel connected in series to said power line and in parallel to said first MOS field effect transistor;

a third MOS field effect transistor of a first conductivity type channel connected in series to said first MOS field effect transistor, and said third MOS field effect transistor having a gate connected to a gate of said first MOS field effect transistor;

a fourth MOS field effect transistor of a first conductivity type channel connected in series to said second MOS field effect transistor, and said fourth MOS field effect transistor having a gate connected to a gate of said second MOS field effect transistor;

a fifth MOS field effect transistor of a first conductivity type channel connected in series between a ground line and both said third and fourth MOS field effect transistors, and said fifth MOS field effect transistor having a gate connected to an activation signal line;

a first input/output line connected to an intermediate point between said first and third MOS field effect transistors and also connected to said gates of said second and fourth MOS field effect transistors; and a second input/output line connected to an intermediate point between said second and fourth MOS field effect transistors and also connected to said gates of said first and third MOS field effect transistors.

12. The semiconductor memory device as claimed in claim 1, wherein said sense amplifier comprises a differential sense amplifier.

13. The semiconductor memory device as claimed in claim 12, wherein said latch sense amplifier comprises:

a first MOS field effect transistor of a second conductivity type channel connected in series to a power line;

a second MOS field effect transistor of a second conductivity type channel connected in series to said power line and in parallel to said first MOS field effect transistor;

a third MOS field effect transistor of a first conductivity type channel connected in series to said first MOS field effect transistor, and an intermediate point between said first and third MOS field effect transistors being connected to a gate of said second MOS field effect transistor;

a fourth MOS field effect transistor of a first conductivity type channel connected in series to said second MOS field effect transistor;

a fifth MOS field effect transistor of a first conductivity type channel connected in series between a ground line and both said third and fourth MOS field effect transistors, and said fifth MOS field effect transistor having a gate connected to an activation signal line;

an output line connected to an intermediate point between said second and fourth MOS field effect transistors;

a first input line connected to a gate of said third MOS field effect transistor;

a second input line connected to a gate of said fourth MOS field effect transistor;

a sixth MOS field effect transistor of a first conductivity type channel being connected in series between said power line and said first input line;

a seventh MOS field effect transistor of a first conductivity type channel being connected in series between said power line and said second input line;

a first inverter having an output terminal connected to a gate of said sixth MOS field effect transistor and an input terminal connected to first one of paired write operation common bit lines connected to said write driver; and a second inverter having an output terminal connected to a gate of said seventh MOS field effect transistor and an input terminal connected to second one of paired write operation common bit lines connected to said write driver.

* * * * *

UNITED STATES PATENT AND TRADEMARK OFFICE
CERTIFICATE OF CORRECTION

PATENT NO. : 6,226,220 B1  
DATED : May 1, 2001  
INVENTOR(S) : Koichi Takeda

Page 1 of 1

It is certified that error appears in the above-identified patent and that said Letters Patent is hereby corrected as shown below:

<u>Title page,</u>
Insert item [30] as follows:

-- [30]   Foreign Application Priority Data  
Sept. 16, 1999     (JP)     Japan ............ 11-262375 --.

Signed and Sealed this

Thirtieth Day of October, 2001

Attest:

*Nicholas P. Godici*

*Attesting Officer*

NICHOLAS P. GODICI  
*Acting Director of the United States Patent and Trademark Office*